United States Patent [19]
Takeda

[11] 3,959,810
[45] May 25, 1976

[54] METHOD FOR MANUFACTURING A SEMICONDUCTOR DEVICE AND THE SAME

[75] Inventor: Takanori Takeda, Kodaira, Japan

[73] Assignee: Hitachi, Ltd., Japan

[22] Filed: June 18, 1970

[21] Appl. No.: 57,890

Related U.S. Application Data

[62] Division of Ser. No. 760,433, Sept. 18, 1968, abandoned.

[30] Foreign Application Priority Data
Oct. 2, 1967 Japan.............................. 42-63057

[52] U.S. Cl.................................... 357/52; 357/89
[51] Int. Cl.².......................................... H01L 29/34
[58] Field of Search.............. 317/235 AG, 235 AM, 317/235 WW, 235 R

[56] References Cited
UNITED STATES PATENTS

| | | |
|---|---|---|
| 3,226,611 | 12/1965 | Halnichen........................... 317/234 |
| 3,303,069 | 2/1967 | Tokuyama........................... 148/187 |
| 3,338,758 | 9/1967 | Tremere............................. 148/33.5 |
| 3,418,181 | 12/1968 | Robinson............................ 148/187 |

*Primary Examiner*—Martin H. Edlow
*Attorney, Agent, or Firm*—Craig & Antonelli

[57] ABSTRACT

A method for manufacturing a PNP type planar transistor, diffusing an acceptor impurity in a non-oxidizing atmosphere to form a P type emitter region in one portion of an N type base region with a first silicon oxide film as a selective mask, depositing a second silicon oxide film from vapor phase on the surface of said emitter region, diffusing selectively a donor impurity in another portion of said base region with said first and second silicon oxide films as selective masks thereby to form an N type highly doped region in said base region.

2 Claims, 18 Drawing Figures

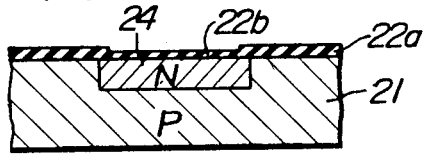
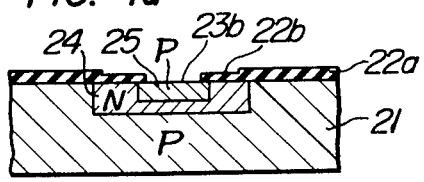
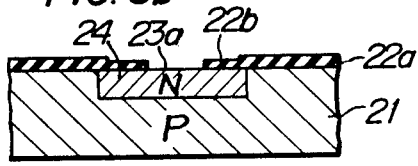
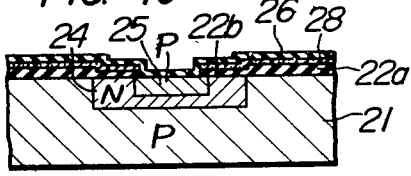
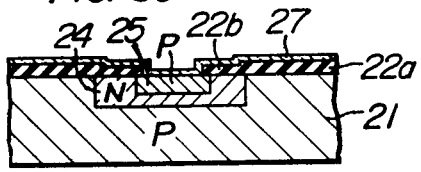
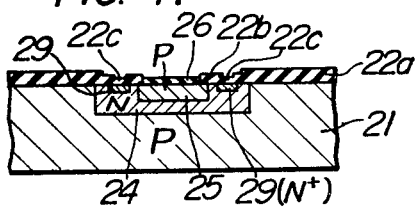
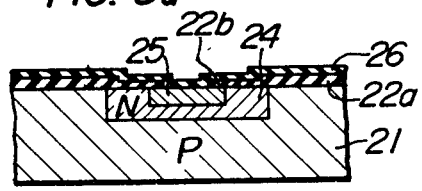
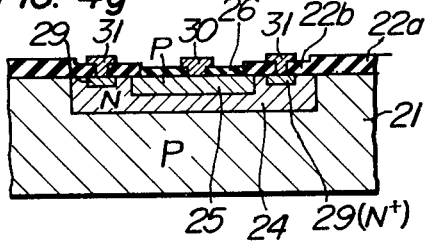
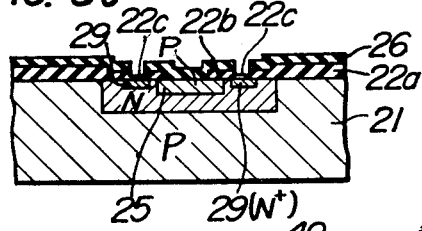
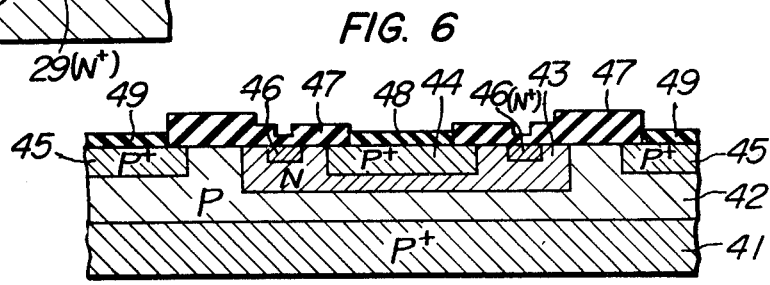

METHOD FOR MANUFACTURING A SEMICONDUCTOR DEVICE AND THE SAME

This is a division of application Ser. No. 760,433 filed Sept. 18, 1968, now abandoned.

This invention relates to a method for manufacturing a semiconductor device and more particularly to an improvement on the manufacturing method of a semiconductor device having a passivation film using the selective diffusion treatment.

The so-called planar transistor is known as a semiconductor device having a passivatioon film, e.g. oxide film, on the surface of its substrate. From an industrial point of view the planar transistor is limited almost to the NPN type. However, in a special case, e.g. in a complementary circuit, the existence of a PNP type transistor with a good reliability is necessary. The reasons for which the advent of the PNP planar type transistor is behind that of the NPN one are as follows.

1. Although the collector region should be P type and have a low impurity concentration, the channel effect of an oxide film is liable to convert the P type collector surface to N type so that the collector can not have a high breakdown voltage.

2. Although the base region should be an N type and have a low impurity concentration, it is difficult to obtain such a low impurity region and an ohmic contact therefor.

3. Although the emitter region should be P type and have a high impurity concentration, the formation of the high impurity region is very difficult.

After various investigations and examinations the following solutions are proposed to remove some of the defects.

As for (1), it is recommended that an annular $P^+$ type highly doped region is formed around the P type collector region. The channel generated on the surface of the collector region is separated by the $P^+$ type region and the influence of the channel effect is eliminated.

As for (2), it is preferable that an $N^+$ type highly doped region is formed on the surface portion of the N type base region. The ohmic contact can be made on this $N^+$ type region. However, no simple and useful method for forming such an $N^+$ type highly doped region is available. Even if it is formed by the conventional selective diffusion method, many inconveniences are accompanied as described later with reference to the drawings.

As for (3), no effective solution is proposed yet, making it difficult to obtain the PNP planar type transistor.

One object of this inventiion is to provide a novel and useful method for manufacturing a semiconductor device having a passivation film and more particularly a PNP transistor.

Another object of this invention is to provide a method for manufacturing a semiconductor device in which a diffused region having a relatively high surface impurity concentration is selectively formed.

Still another object of this invention is to provide a method for manufacturing a PNP type transistor having excellent electrical characteristics and high reliability.

A further object of this invention is to provide a method for preventing unwanted influences, e.g. a decrease in the surface impurity concentration brought forth by the redistribution phenomenon of the impurity determining the conductivity type in the surface of a substrate. This phenomenon arises when silicon oxide is thermally grown from the surface of the silicon semiconductor substrate containing the impurity.

Still another object of this invention is to provide a highly efficient PNP type planar transistor having a high current amplification factor, a high collector breakdown voltage, a low noise characteristic and good stability.

According to an embodiment of this invention, a first insulating film, e.g. a silicon oxide film, is thermally grown on the surface of a semiconductor substrate, e.g. silicon, having an N type semiconductor region on one principal surface thereof. One portion of the first silicon oxide film is removed. The remaining portion is used as a selective mask and an acceptor impurity is highly doped in one surface portion of the N type region in an anon-oxidizing atmosphere. Thus a P type semiconductor region of high impurity concentration is formed. In this case a deposited impurity layer containing the acceptor and/or its oxide is formed on the surface of the P type region. Then, the deposited layer is removed to expose a portion of the surface of the P type region, on which a second insulating film, e.g. a silicon oxide film, is formed using e.g. the conventionally known pyrolytic reaction which forms an insulating film at a low temperature so that the acceptor impurity may not diffuse again. Selective introduction of donor impurity is further done if necessary on the surface of the N type semiconductor region with the first and second oxide films as selective masks. A decrease in the surface impurity concentration in the $P^+$ type highly doped region brought forth by the selective introduction of donor impurity is almost negligible due to the existence of the second silicon oxide film. The purpose of the above selective introduction treatment is to form an $N^+$ type highly doped region for making the base ohmic contact in the PNP transistor.

Other objects and advantages of this invention will be made more apparent by the detailed explanation of this invention taken in conjunction with the accompanying drawings, in which;

FIGS. 3a to 3c, FIGS. 4d to 4g and FIGS. 5d to 5e are cross sectional views of a semiconductor wafer in each step of the method for manufacturing a semiconductor device according to this invention; and FIG. 6 is a cross sectional view of a semiconductor device according to one embodiment of this invention.

In order to understand this invention easily the conventional method for manufacturing a PNP type planar transistor will be explained first in the order of steps referring to FIG. 1. The reasons for the abovementioned defects will be explained together.

Figure 1A:
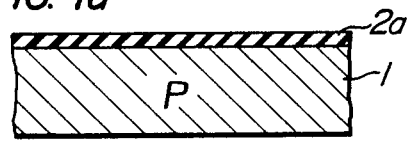
FIGS. 1a and 1f are cross sectional views of a semiconductor wafer in each step of a conventional method for forming a semiconductor device.

Step (a): A P type silicon substrate 1 is heated at about 1000°C, for three hours in an oxidizing atmosphere thereby to grow a silicon oxide film 2a of about 6000 A on the surface (FIG. 1a).

Figure 1B:
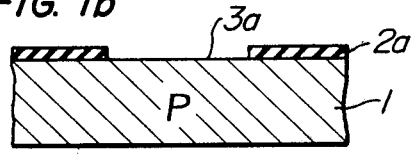

Step (b): The photoetching treatment is performed on the substrate 1 to remove unwanted portions of the oxide film 2a and form an exposed surface 3a (FIG. 1b).

Figure 1C:
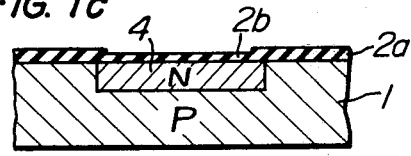

Step (c): The substrate 1 is treated at about 1200°C. for 2 hours in an oxidizing atmosphere containing phosphorus or antimony thereby to diffuse phosphorus or antimony into the exposed surface 3a and form an N type base region 4. The exposed surface 3a is again covered with a silicon oxide film 2b newly grown from the surface of substrate 1 (FIG. 1c).

Figure 1D:
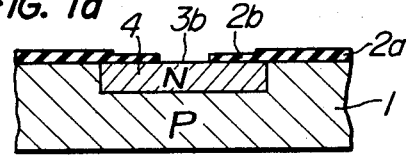

Step (d); The photoetching treatment is done on the surface of substrate 1 to remove the undesired portion of the oxide film 2b and form an exposed surface 3b on the substrate 1 (FIG. 1d).

Figure 1E:
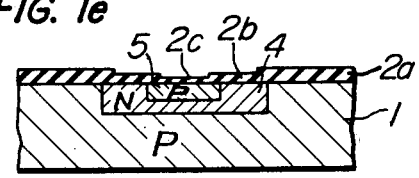

Step (e): The substrate 1 is heated in the atmosphere containing boron thereby to form a deposition layer containing boron on the exposed surface 3b. Thereafter by a 15 minutes treatment at about 1000°C. in an oxidizing atmosphere boron is diffused from the exposed surface 3b to form a P type emitter region 5. The exposed surface 3b is again covered with an oxide film 2c newly grown from the surface of substrate 1 (FIG. 1e)

Figure 1F:
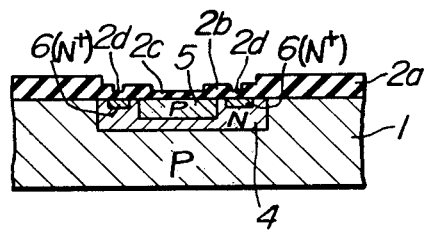

Step (f): One portion of the oxide film 2b is perforated to form selectively an N⁺ type highly doped region 8 for the ohmic contact with the base region 4. The surface of the region 6 is covered with an oxide film 2d newly and thermally grown from the surface of the substrate (FIG. 1f).

In the above manufacturing method of a planar transistor the oxide films 2a, 2b, 2c and 2d thermally grown from the silicon substrate 1 by the heat treatment have a big influence on the distribution of the impurity concentration on the surface of the semiconductor region thereunder, and this has prevented the advent of an excellent PNP type transistor.

The boundary between the silicon substrate and the oxide film grown by heat treatment therefrom moves into the substrate, as the film grows gradually consuming the silicon substrate. Therefore, the redistribution of impurity determining the conductivity type occurs in the surface of the silicon substrate. The impurity presents two different phenomena, i.e. the pile-up phenomenon or the depletion phenomenon, depending on whether it remains in the substrate or moves towards oxide film when the formation of the film is finished.

The segregation coefficient K will be expressed by $$K = \frac{\text{average concentration of impurity in the silicon substrate}}{\text{average concentration of impurity in the oxide film}}$$

K < 1 corresponds to the depletion phenomenon, i.e. the oxide film acts to absorb the impurity in the silicon substrate, as observed when P type impurity e.g. boron is diffused in the substrate using the oxide film as a mask.

K < 1 corresponds to the pile-up phenomenon, i.e. the oxide film forces the impurity to remain in the silicon substrate, as observed when N type impurity e.g. phosphorus or antimony, is diffused in the substrate using the oxide film as a mask. Therefore, the P type region causes the depletion phenomenon and decreases the impurity concentration in the surface while the N type region causes the pile-up phenomenon and increases the impurity concentration in the surface.

Figure 2A:
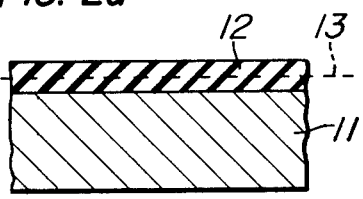
FIG. 2a is a cross sectional view of a semiconductor wafer showing the state where an oxide film is growing from the surface of a semiconductor substrate.
Figure 2B:
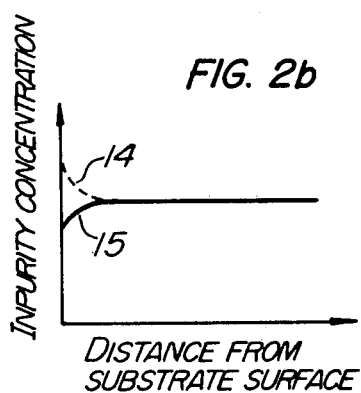
FIG. 2b shows the distribution of impurity concentration in the above semiconductor substrate.

The above-mentioned phenomena are seen in FIGS. 2a and 2b. FIG. 2a shows an oxide film 12 grown on the surface of a silicon substrate 11, the dotted position 13 being the initial surface position of the substrate. The boundary between the substrate 11 and the oxide film 12 moves gradually into the substrate as the substrate is eaten away by the oxide film. FIG. 2b shows the distribution of impurity concentration in the substrate 11. When the substrate 11 is P type, the surface concentration is decreased by the depletion phenomenon as shown by the solid line 15 while when the substrate 11 is N type it is increased by the pile-up phenomenon as shown by the dotted line 14.

The emitter diffused layer 5 in the step (e) has usually a small thickness of about 1 μ and needs to have a high impurity concentration of about $10^{20}$ atoms/cc. Although an extremely short time diffusion treatment can satisfy these requirements, if the insulating film containing boron oxide is extremely thin the passivation of the emitter region from the external atmosphere and the role of the diffusion mask during the formation of a highly doped region 6 in the base can not be expected.

In order to circumvent this shortcoming, after the emitter region is formed shallowly and given a high surface impurity concentration or an acceptor impurity is deposited, the so-called extensiion diffusion treatment is practiced in the emitter. Namely the surface of the emitter region is exposed to a high temperature oxidizing atmosphere containing no acceptor impurity and its depth is slightly increased without changing the surface impurity concentration while an oxide film having a relatively large thickness is formed on the emitter region. However, when an oxide film is thermally formed, the P type emitter region even though designed to have a high impurity concentration decreases its surface concentration by the depletion phenomenon. So, the spread of the depletion layer in the emitter-base junction increases particularly in the surface. The noise characterisitc is thereby deteriorated. As the emitter junction efficiency is affected, the current amplification factor $h_{fe}$ is degraded.

This invention aims to obviate such defects and provides a method for manufacturing a semiconductor device in which a P type region is formed in a desired portion of an N type semiconductor region, characterized in that the surface of an N type region is covered with an insulating film, e.g. an oxide film, grown from the semiconductor substrate while the surface of a P type region is covered with another insulating film, e.g. an oxide film, formed by other methods such as vapor deposition, etc.

Explanation of an embodiment of this invention will be made hereinafter with reference to the accompanying drawings. FIGS. 3a to 3c and FIGS. 4d to 4g show a series of manufacturing steps of a PNP transistor. In FIG. 4g, 21 is a P type collector region, 24 is an N type base region and 25 is a P type emitter region. 22a and 22b show oxide films, e.g. silicon dioxide films, grown on the surface of the P type silicon substrate 21 by heat treatment. The layer 26 is an insulating film, e.g. silicon dioxide, formed only on the surface of the emitter region 25. The insulating film 26, which differs from those made by thermal formation, is formed at such a low temperature that the impurity determining the conductivity type in the semiconductor may not move. The film 26 is not grown from the surface of the substrate but deposited by thermal decomposition of organosilane at a relatively low temperature of 700° to 800°C. Other methods such as chemical vapor deposition and sputtering may be used to form this film 26. 29 is an N⁺ type highly doped region to make the base electrode ohmically contact with the base region 24. 30 and 31 are emitter and base electrodes respectively.

Processes to obtain the structure as shown in FIG. 4f will be explained hereafter referring to FIGS. 3a to 3c and FIGS. 4d to 4g.

Step (a): A P type silicon substrate 21 in which an N type base region 24 is formed by diffusion of donor impurity, e.g. antimony, is prepared. On the surface of the substrate 21 silicon oxide films 22a and 22b with a thickness of 3000 to 10,000 A are thermally grown from the surface (FIG. 3a).

Side (b): The photoetching treatment is performed on the surfaces of the oxide films 22a and 22b to eliminate unwanted portions of the oxide film 22b on the base region 24 and form an exposed surface 23a (FIG. 3b).

Step (c): The substrate 21 is heated for 50 minutes at about1030°C. in a non-oxidizing atmosphere, e.g. nitrogen, containing an acceptor impurity, e.g. boron. Boron is deposited and diffused slightly on the surface of substrate 21 inluding exposed surface 23a, thereby forming a shallow (about 1 $\mu$) high concentration (about $0.9 \times 10^{20} \sim 3 \times 10^{20}$ atoms/cc.) emitter region 25. A vitrified layer 27 containing boron oxide is produced on the surface of substrate 21 and the oxide films 22a and 22b (FIG. 3c).

Step (d): The substrate 21 is dipped in an etching solution to remove the boron glass layer 27 and form an exposed surface 23b again in the surface of the emitter region 25 (FIG. 4d).

Step (e): A photoresist film 28 is placed on the oxide films 22a and 22b and the substrate 21 is maintained in vacuum. By the thermal decomposition of organoxysilane e.g. tetraethoxysilane at about 750°C. or monosilane at about 320°C., a silicon oxide film 26 is deposited about a few thousand A on the surface of the substrate 21 including the exposed surface 23b. The oxide film 26 may be replaced by other oxide films, e.g. $Al_2O_3$ film, formed by so-called low temperature chemical vapor deposition or a silicon nitride film or used in combination with these films (FIG. 4e).

Step (f): The undesired portion of the oxide film 26 is removed together with the photoresist film 28 so that it remains only on the surface of the emitter region 25. The $N^+$ type highly doped region 29 for the ohmic contact of the base electrode is formed by selective diffusion of a donor impurity such as phosphorus. In this case the oxide film 22a, the perforated oxide film 22b and the deposited oxide film 26 act as diffusion masks. A new silicon oxide film 22c is formed on the surface of the $N^+$ type region 20 (FIG. 4f).

Step (g): The oxide films 22c and 26 are perforated and base and emitter electrodes 31 and 30 are fitted to a portion of the $N^+$ type highly doped region 29 and a portion of the emitter region 25 respectively which are exposed by the holes. The electrode material may be made of not only aluminum but also molybdenum and zirconium which are resistant to high temperature treatment. Although aluminum is a III Group element and hence acts as an acceptor impurity, it can be ohmically in contact with the N type base region 24 due to the existence of the $N^+$ type region 20 (FIG. 4g).

When a PNP planar transistor is manufactured in accordance with the above steps, where the P type emitter region of high impurity concentration is formed in a non-oxidizing atmosphere and the surface of the emitter region is covered with the oxide film 26 formed by external deposition at a relatively low temperature not by the high temperature, growth from the substrate, the depletion phenomenon does not appear in the emitter region. Since the oxide film 26 can be formed sufficiently thick on the surface of the emitter region, the passivation of the emitter surface from the external atmosphere is effectively done. The deposited oxide film 26 can be effectively used as a diffusion mask during the formation of the $N^+$ type region. Although the deposited oxide film 26 in the step (e) is rather porous, it is made fine by the high temperature diffusion treatment in the step (f) and becomes preferable for the passivation of the emitter region.

Since the thermally formed oxide film 22b remains on the surface of the N type base region 24 and the impurity concentration in the surface of the base region 24 is enhanced by the pile-up phenomenon, the diffusion treatment for the formation of the $N^+$ region for the ohmic contact is simply and advantageously performed.

Therefore, according to this invention the highly concentrated emitter region is obtained with good reproducibility, since the spread of the depletion layer in the emitter-base junction is prevented. The variation of the current amplification factor is reduced. The formation of the $N^+$ type region can decrease the base resistance. Since a new clean oxide film is formed after cleaning only the surface of the emitter region without applying any treatment on the base region, a low noise PNP planar transistor can be obtained. It is found through the inventor's experiment that the existence of the thermally formed oxide film on the base region is particularly good for suppressing noise. Therefore, the film is preferably left on the base region.

FIGS. 5d and 5e following FIG. 3c show another embodiment modifying the above embodiment. In FIGS.5d and 5e like reference numerals are used to denote like parts as shown in FIGS. 3a to 3c and FIGS. 4d to 4g. So only different portions will be explained. According to this embodiment, after the boron glass layer 27 is removed, a silicon oxide film 26 is deposited from vapor phase on the emitter region 25 and the oxide film 22a and 22b, as shown in FIG. 5d. Next, portions of the oxide film 22b and 26 are removed to form an $N^+$ type region 29 by the selective diffusion technique as shown in FIG. 5e. This method possesses an advantage in addition to that of the foregoing embodiment in that the surface passivation of the transistor is strengthened.

FIG. 6 shows a transistor according to a further embodiment of this invention. This PNP type planar transistor is obtained in the following manner. First, an N type base layer 43 is formed by selective diffusion in the P type epitaxial silicon layer 42 on a $P^+$ type silicon substrate 41. Next with the oxide film 47 as a selective mask a $P^+$ type emitter region 44 is formed by diffusion in the base region 43 and a $P^+$ type annular region 45 around it simultaneously. The emitter region 44 and the annular region 45 are exposed, and insulating films 48 and 49, e.g silicon oxide films, are deposited from vapor phase on the exposed portions. Then an $N^+$ type highly doped region is formed in the base region 43.

The PNP type planar transistor thus obtained has a high collector breakdown voltage and a small collector saturation resistance in addition to the foregoing advantages of this invention. These characteristics are due to the facts that the annular region 45 is formed to have an impurity concentration as high as that of the emitter region 44, and that a silicon wafer in which the epitaxial layer 42 with a relatively low impurity concentration is formed on the silicon substrate with a relatively high impurity concentration can be utilized.

Although the above explanation of particular examples of this invention has been relating only to transistors, this inventioon is not limited by them.

What is claimed is:

1. A PNP semiconductor device comprising:
a P-type collector region having a principal surface;
an N-type base region having a principal surface;
a PN junction formed between said collector region and said base region;
a P type emitter region formed in one portion of the principal surface of said base region;
an N type highly doped region formed in the other portion of the principal surface of said base region;
a first silicon oxide film deposited from vapor phase to cover at least the surface of said P type emitter region;
a second silicon oxide film thermally grown from the substrate to cover at least the surface of said base region; and
an electrode fitted to the surface of said highly doped region.

2. A PNP semiconductor device comprising:
a semiconductor substrate of P type silicon with a relatively low impurity concentration having one principal surface;
a first N type diffused base region with a relatively low impurity concentration formed in said principal surface;
a first P type diffused emitter region with a relatively high impurity concentration formed in one portion of the surface of said first N type diffused base region;
a second N type diffused region with a relatively high impurity concentration formed in another portion of the surface of said first N type diffused base region;
a first silicon oxide film deposited from vapor phase to cover the surface of said first P type diffused emitter region;
a second silicon oxide film thermally grown from said substrate to cover said first N type diffused base region and the termination of the base-emitter junction; and
a first and a second electrode fitted to the surfaces of said P type diffused emitter region and said second N type diffused region, respectively.

* * * * *